(12) United States Patent
Yu et al.

(10) Patent No.: US 8,487,377 B2
(45) Date of Patent: Jul. 16, 2013

(54) MOSFET LAYOUT AND STRUCTURE WITH COMMON SOURCE

(75) Inventors: Chung-Che Yu, New Taipei (TW); Kuo-Wei Peng, New Taipei (TW); Li-Min Lee, New Taipei (TW)

(73) Assignee: Green Solution Technology Co., Ltd., New Taipei (TW)

( * ) Notice: Subject to any disclaimer, the term of this patent is extended or adjusted under 35 U.S.C. 154(b) by 246 days.

(21) Appl. No.: 13/092,992

(22) Filed: Apr. 25, 2011

(65) Prior Publication Data

US 2012/0061771 A1   Mar. 15, 2012

(30) Foreign Application Priority Data

Sep. 13, 2010   (CN) .......................... 2010 1 0281515

(51) Int. Cl.
*H01L 27/02* (2006.01)
(52) U.S. Cl.
USPC ........................................ 257/342
(58) Field of Classification Search
USPC ................................ 257/342, 401
See application file for complete search history.

(56) References Cited

U.S. PATENT DOCUMENTS

| | | | |
|---|---|---|---|
| 6,002,156 | A | 12/1999 | Lin |
| 6,388,292 | B1 | 5/2002 | Lin |
| 2008/0157195 | A1 | 7/2008 | Sutardja et al. |
| 2009/0189220 | A1 | 7/2009 | Lee et al. |
| 2009/0250751 | A1* | 10/2009 | Sutardja et al. ............... 257/335 |

FOREIGN PATENT DOCUMENTS

| | | |
|---|---|---|
| CN | 101546764 A | 9/2009 |
| CN | 101714548 A | 5/2010 |

* cited by examiner

*Primary Examiner* — Thomas L Dickey
(74) *Attorney, Agent, or Firm* — CKC & Partners Co., Ltd.

(57) ABSTRACT

A MOSFET layout is disclosed. The MOSFET comprises a drain region, a gate region, a source region and a body region. The gate region is disposed outside the drain region and adjacent to the drain region. The source region has a plurality of source sections, which are disposed outside of the gate region and adjacent to the gate region. Each of two adjacent source sections has a source blank zone there between. The body region has at least two body portions, which are disposed at the source blank zones and adjacent to the gate region.

16 Claims, 7 Drawing Sheets

US 8,487,377 B2

MOSFET LAYOUT AND STRUCTURE WITH COMMON SOURCE

RELATED APPLICATIONS

This application claims priority to Chinese Application Serial Number 201010281515.5, filed Sep. 13, 2010, which is herein incorporated by reference.

BACKGROUND

1. Technical Field

The present disclosure relates to a MOSFET layout and structure, more particularly to a MOSFET layout and structure with common source.

2. Description of Related Art

Following the miniaturization of the volume of electrical product, the request for metal oxide field effect transistor (MOSFET) is tended to be smaller scale, higher operating frequency and higher stability. In the MOSFET, the current densities and turn-on resistance may influence the operating frequency and stability of the MOSFET. Wherein, the current densities and the width of the gate are in direct proportion. The current densities and the length of the gate are in inverse proportion. A conventional method for raising the current densities is increasing the effective width of the gate. However, when the MOSFET applies to the power management circuit, it needs a capacity for the electrostatic discharge (ESD) and so the ESD protection circuit must have bigger drain and source to sustain the damage of the ESD current. But the foregoing method will also cause a question, for example, the bigger layout area and the lower integration of the MOSFET.

FIG. 1 is a schematic diagram of a conventional power MOSFET layout. Referring to FIG. 1, in a single MOSFET, a drain zone 10 is surrounded by a gate region 12. A source region 14 is distributed around the gate region 12. Beside from that, a body region 16 is distributed outside the source region 14. Such that the current densities are raised by increasing the effective width of the gate. As shown in FIG. 1, the body region 16 is located between two source regions 14 of two neighboring power MOSFET. Thus, the body region 16 is used in common by two neighboring power MOSFET.

However, the drain region 10 must sustain a high-voltage due to electrostatic discharge. The width of the drain region 10 is wider than the source region 14. So, the power MOSFET occupies bigger layout area, such that the integration of the MOSFET layout is still lower.

Therefore, it becomes important issue that how to hold the sustainable capacity for the electrostatic discharge (ESD) with smaller layout area to raise the integration of the MOSFET layout.

SUMMARY

In the foregoing related art, the integration of the MOSFET layout is still lower. The invention uses the common source to further improve the integration of the MOSFET layout.

To accomplish the aforementioned and other objects, an exemplary embodiment of the invention provides a MOSFET layout. The MOSFET layout comprises a drain region, a gate region, a source region and a body region. The gate region is disposed outside the drain region and adjacent to the drain region. The source region has a plurality of source sections, which are disposed outside the gate region and adjacent to the gate region. Each of two adjacent source sections has a source blank zone there between. The body region has at least two body portions, which are disposed at the source blank zones and adjacent to the gate region.

Furthermore, another exemplary embodiment of the invention provides a MOSFET structure. The MOSFET structure comprises a first MOSFET and a second MOSFET. The first MOSFET comprises a first drain region, a first gate region, a first source region, and a first body region. The second MOSFET comprises a second drain region, a second gate region, a second source region, and a second body region. The first gate region is disposed outside the first drain region and adjacent to the first drain region. The first source region is disposed outside the first gate region and adjacent to the first gate region. The first body region has at least two first body portions, which are disposed outside the first gate region and adjacent to the first source region. The second gate region is disposed outside the second drain region and adjacent to the second drain region. The second source region is disposed outside the second gate region and adjacent to the second gate region. The second body region has at least two second body portions, which are disposed outside the second gate region and adjacent to the second source region. Wherein, the partial region of the first source region and the partial region of the second source region are in common.

It is to be understood that both the foregoing general description and the following detailed description are exemplary, and are intended to provide further explanation of the invention as claimed. In order to make the features and the advantages of the invention comprehensible, exemplary embodiments accompanied with figures are described in detail below.

BRIEF DESCRIPTION OF THE DRAWINGS

The present invention will now be specified with reference to its preferred embodiment illustrated in the drawings, in which.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
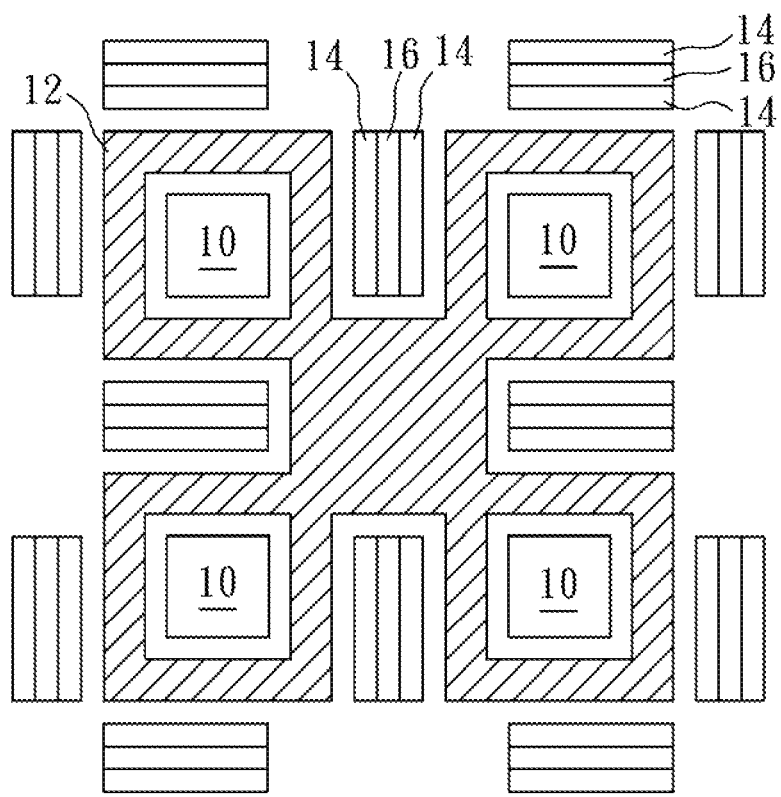
FIG. 1 is a schematic diagram of a conventional power MOSFET layout.
Figure 2:
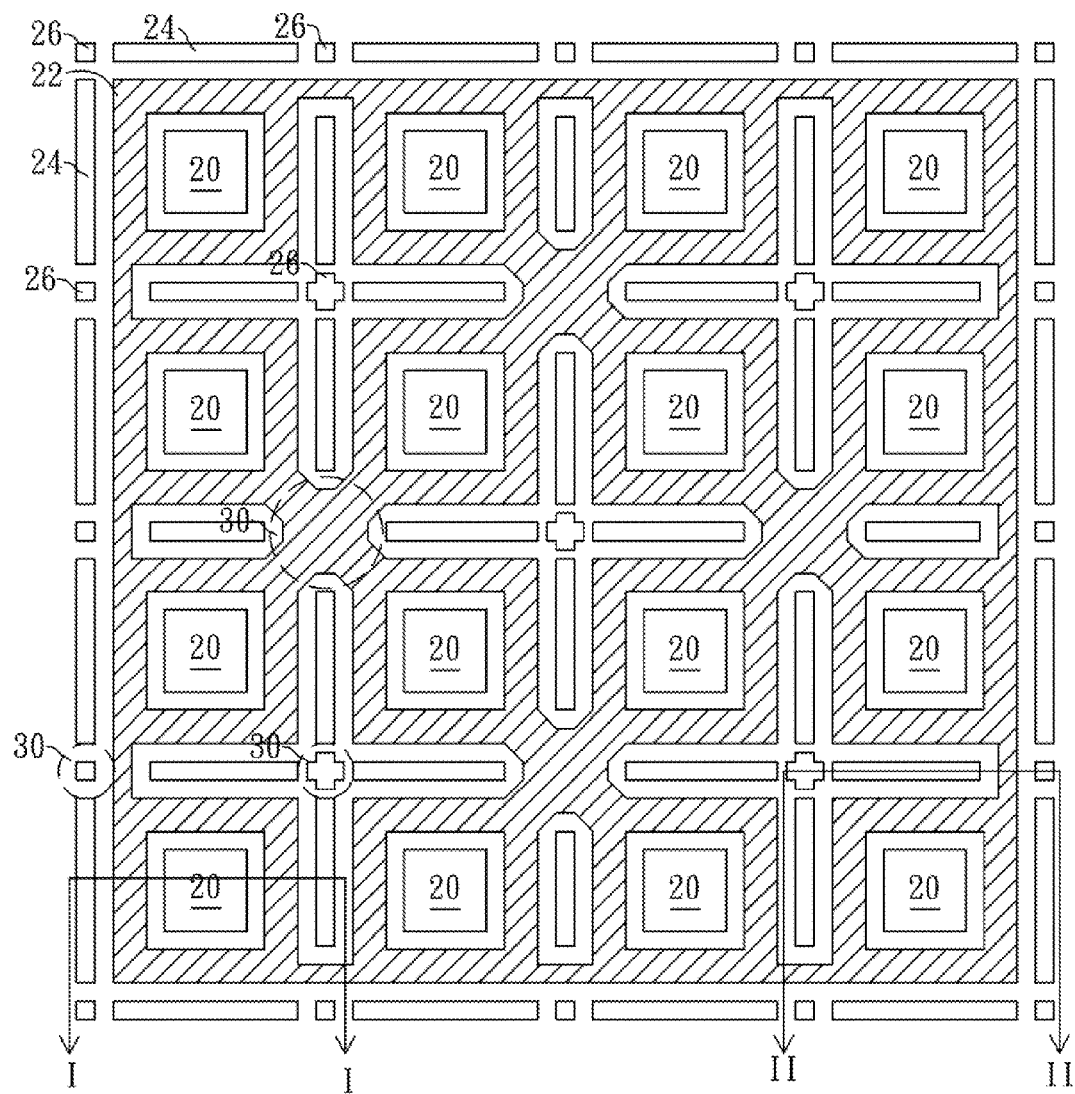
FIG. 2 is a schematic diagram of a MOSFET layout according to a first embodiment of the invention.
Figure 3:
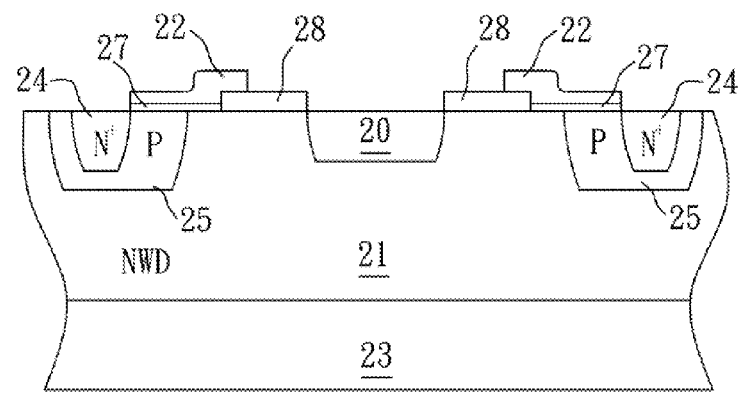
FIG. 3 is a schematic diagram of a single MOSFET structure along a section line I-I shown in FIG. 2.
Figure 4:
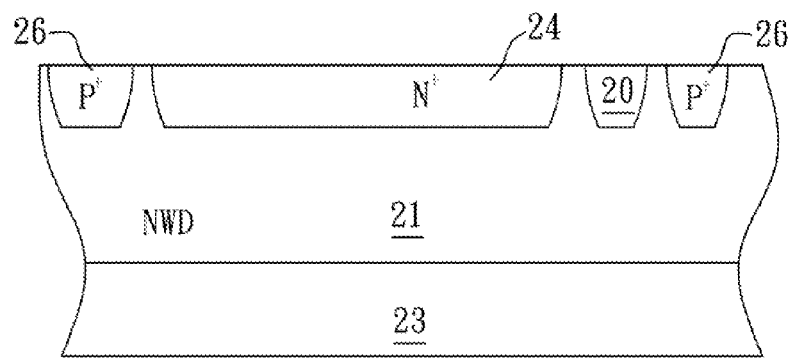
FIG. 4 is a schematic diagram of a single MOSFET structure along a section line II-II shown in FIG. 2.

FIG. 2 is a schematic diagram of a MOSFET layout according to a first embodiment of the invention. FIG. 3 is a schematic diagram of a single MOSFET structure along a section line I-I shown in FIG. 2. FIG. 4 is a schematic diagram of a single MOSFET structure along a section line II-II shown in FIG. 2 In the present embodiment, the MOSFET layout is described by the 4×4 array structure in detail below. Referring to FIG. 2, FIG. 3, and FIG. 4, an N-type deep well 21 is formed above an epilayer 23 and MOSFET is formed above the N-type deep well 21. The MOSFET comprises a drain region 20, a gate region 22, a source region 24, and a body region 26. The gate region 22 is disposed outside the drain region 20 and adjacent to the drain region 20. There is a field oxide (FOX) 28 between the gate region 22 and drain region 20. P-type doping area 25 is formed within the N-type deep well 21. Parts of the P-type doping area 25 and the gate region 22 are separated by an insulator layer 27, and the other parts are proceeded by the N-type doping to be formed the source region 24. The source region 24 is formed outside the gate region 22 and adjacent to the gate region 22. The source region 24 of single MOSFET has many source sections; the source sections mean a sequential region of the source layers. Each of two adjacent source sections has a source blank zone 30 there between. The body region 26 has formed in the source blank zone 30 and is adjacent to the gate region 22. Strictly speaking, the body region 26 of single MOSFET has at least two body portions, which are formed in the source blank zones 30 among the plurality of source sections. The body portion means the structure which is located in the source blank zone 30 and serves as a body. Each body portion is adjacent to one or many source sections. The above-mentioned description is not indicated that each of the source blank zones 30 all has the body portions. In principle, each of the source sections is adjacent to at least one body portion, such that each of the body portions of the body region 26 can also be adjacent to with the source sections of the source region 24 so as to have the same potential.

In the present embodiment, the shape of the drain region 20 is a quadrilateral and has four corners. Owing to the layout design, there are layout difference between MOSFET in the periphery and MOSFET in non-periphery. In the following, take MOSFET in the non-periphery for example. Each of the body regions 26 of MOSFETs has two body portions, which are formed at two diagonal corners of the four corners of the drain region 20. Each of the gate regions 22 of MOSFETs has extending regions, corresponding to other two diagonal corners of the four corners of the corresponding drain region 20, to connect to the gate regions 22 of adjacent MOSFETs. Each of the source regions 24 of MOSFETs has four source sections, which are corresponding to four sides of the drain source 20 respectively. For the MOSFET layout structure, every two adjacent MOSFET uses the source region 24 and body region 26 in common. In other words, the four sides of MOSFETs are all adjacent to MOSFETs correspondingly to use the four source sections of the source region 24 in common respectively. Furthermore, each of the body portions of the body region 26 is adjacent to four source sections, i.e. the MOSFETs, corresponding to the four source sections use the body portion in common. Each of the source sections is adjacent to one body portion correspondingly.

Through the common use of the source region 24 and the body region 26, the invention can reduce the area of the MOSFET to further improve the integration of the MOSFET, compared with the conventional.

In the above embodiment, the position of the source blank zone 30 is at the corners of the corresponding drain region 20. However, the source blank zone 30 can also be formed at the sides of the corresponding drain region 20 in practice. The above profile diagram takes MOSFET process (CMOS) as an example. Actually, the MOSFET process can apply CMOS (HV-CMOS), CMOS-DMOS (Bipolar-CMOS-DMOS), SOI, or any other process to form the MOSFET of the invention.

As follows describe others embodiments of the probable forms for MOSFET layout and structure.

Figure 5:
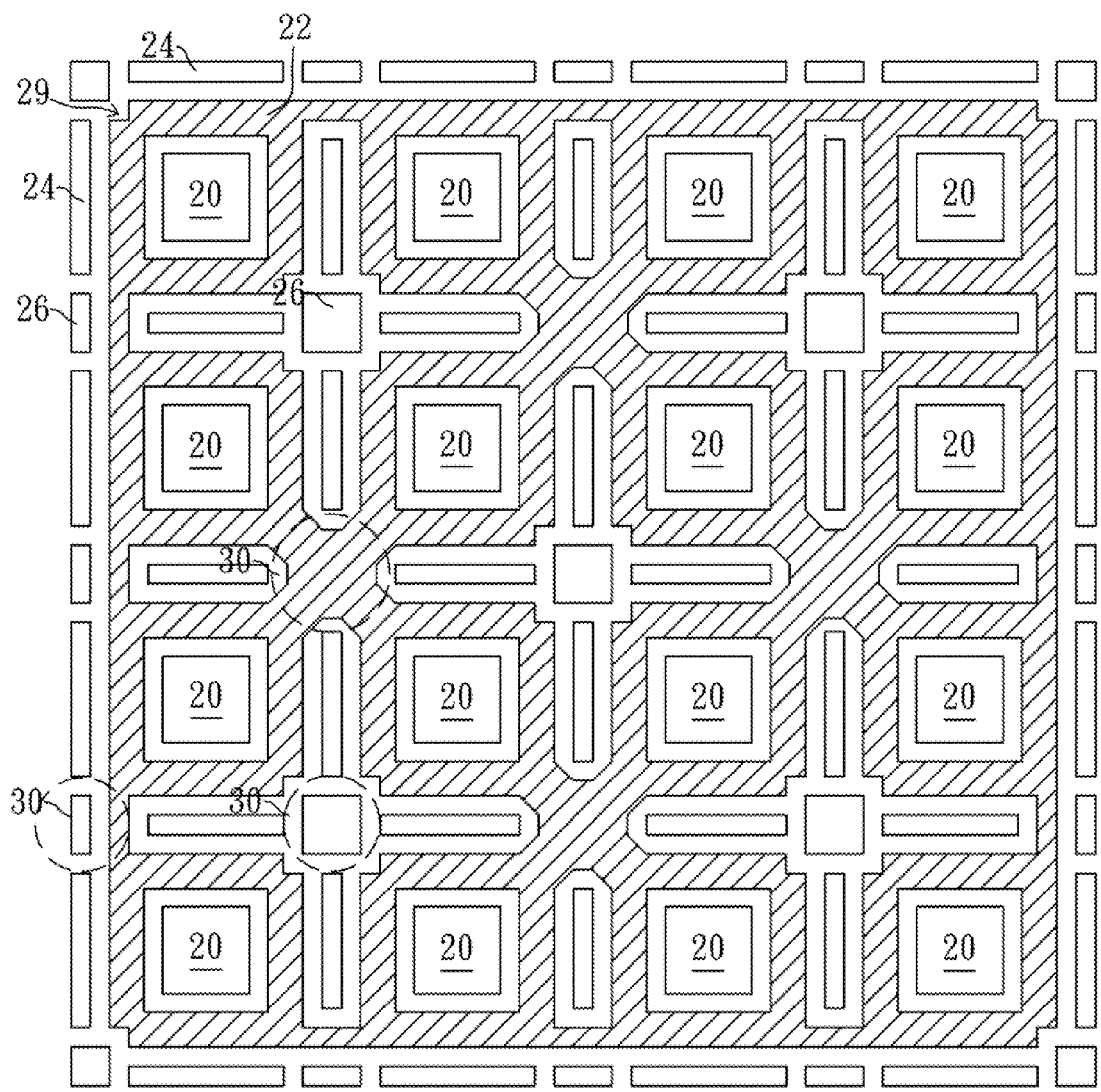
FIG. 5 is a schematic diagram of a MOSFET layout according to a second embodiment of the invention.

FIG. 5 is a schematic diagram of a MOSFET layout according to a second embodiment of the invention. Referring to FIG. 5, Compared with FIG. 2, the different points are that parts of the gate region 22 is formed a gate window region 29 corresponding to the body portion of the body region 26. In the present embodiment, the gate window region 29 is an indentation, such that the distance between the side of the gate region 22 and the corresponding side of the body portion of the body region 26 are the same. For this reason, the body portion of the body region 26 in the present embodiment has bigger area.

Figure 6:
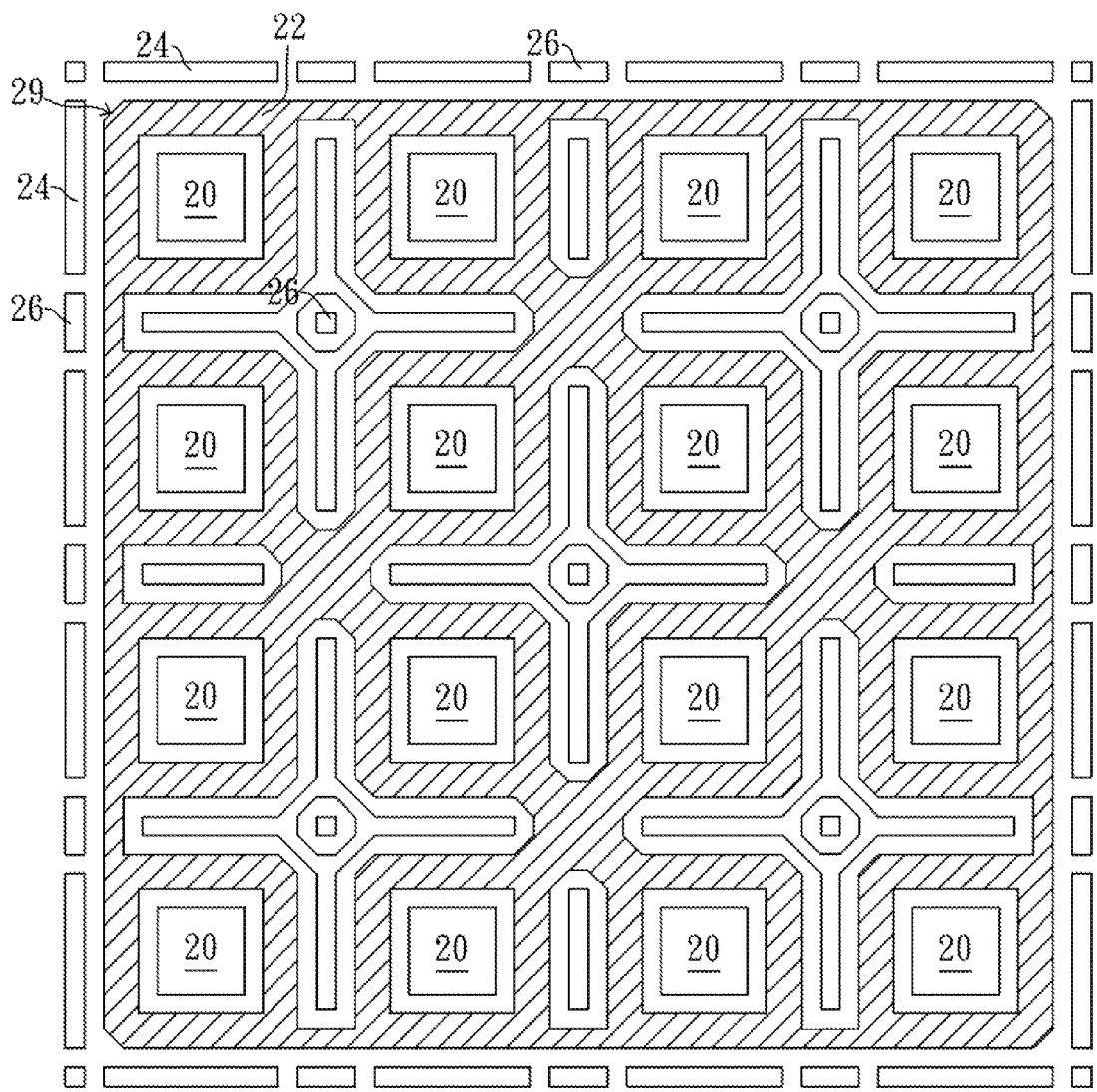
FIG. 6 is a schematic diagram of a MOSFET layout according to a third embodiment of the invention.

FIG. 6 is a schematic diagram of a MOSFET layout according to a third embodiment of the invention. Compared with the FIG. 2, the different point is that some of the source sections of the source region 24 have connected with each other, such that the body portions of the body region 26 are surrounded by the source region 24. Thus, the body region 26 is not adjacent to the gate region 22 and just adjacent to the source region 24. Besides, the corresponding gate regions 22 are also cut off to form the gate window regions 29.

Figure 7:
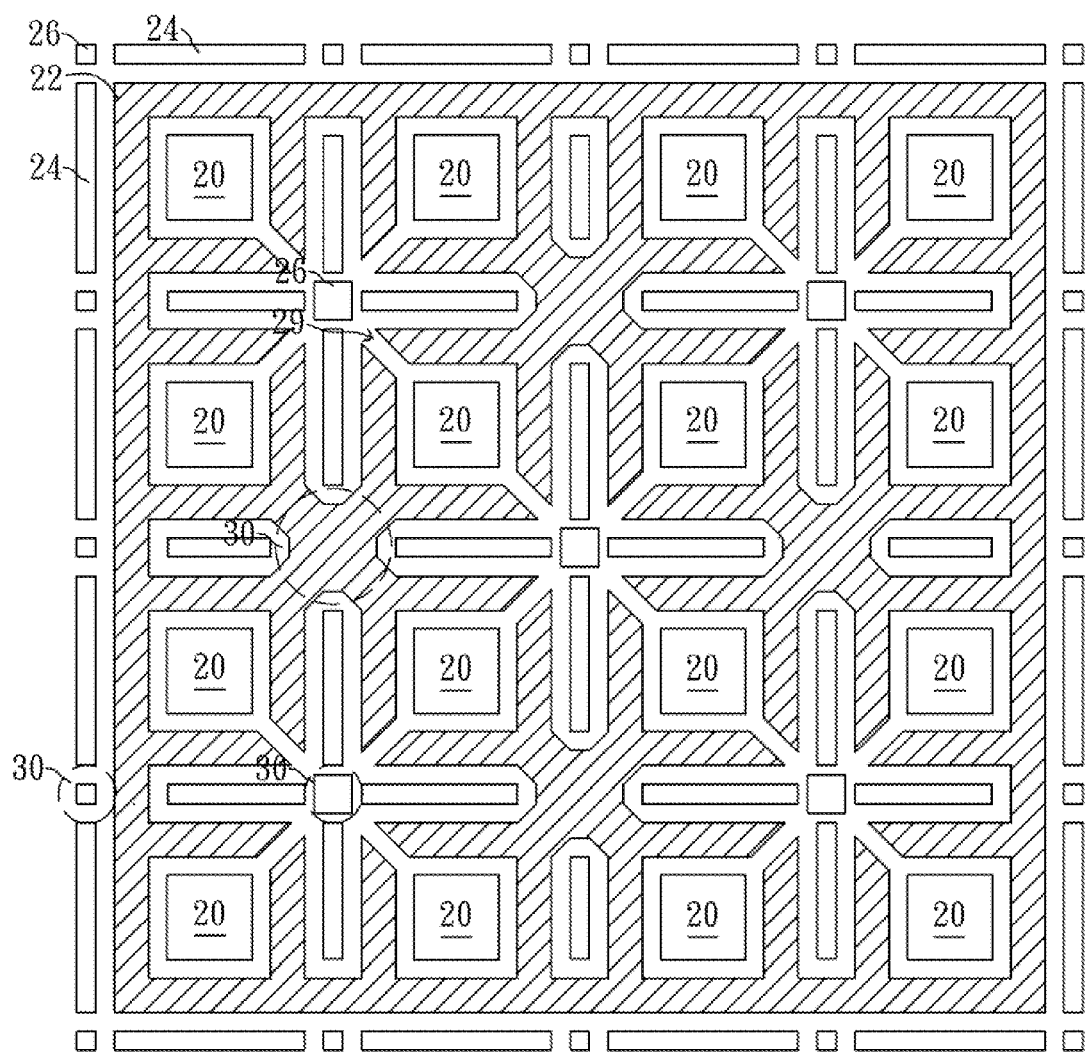
FIG. 7 is a schematic diagram of a MOSFET layout according to a fourth embodiment of the invention.

FIG. 7 is a schematic diagram of a MOSFET layout according to a fourth embodiment of the invention. Compared with FIG. 2, the different points are that a gate window region 29, corresponding to the body portion of the body region 26, is formed in the gate region 22. In the present embodiment, the gate window region 29 is a cutting line. It means that each of the gate regions 22 of MOSFETs has two gate window regions 29, such that the gate region 22 does not surround the drain region 20 entirely. But the gate region 22 surrounds the drain region 20 entirely in the FIG. 2.

Figure 8:
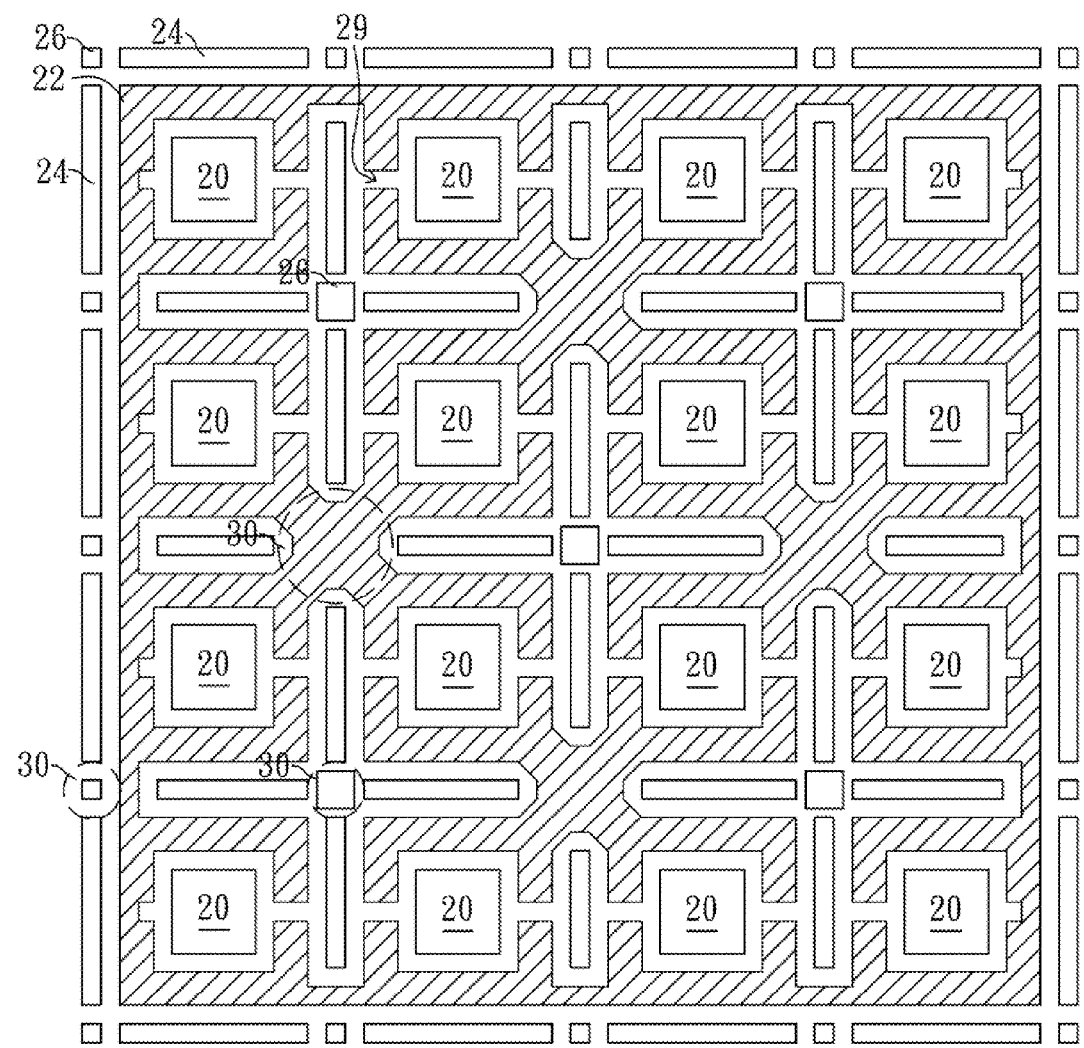
FIG. 8 is a schematic diagram of a MOSFET layout according to a fifth embodiment of the invention.

FIG. 8 is a schematic diagram of a MOSFET layout according to a fifth embodiment of the invention. Compared with FIG. 7, the different points are that the gate window region 29 is not formed at the corner of the drain region 20, i.e. not corresponding to the body portion of the body region 26, but formed at a corresponding position of the side of the drain region 20.

Figure 9:
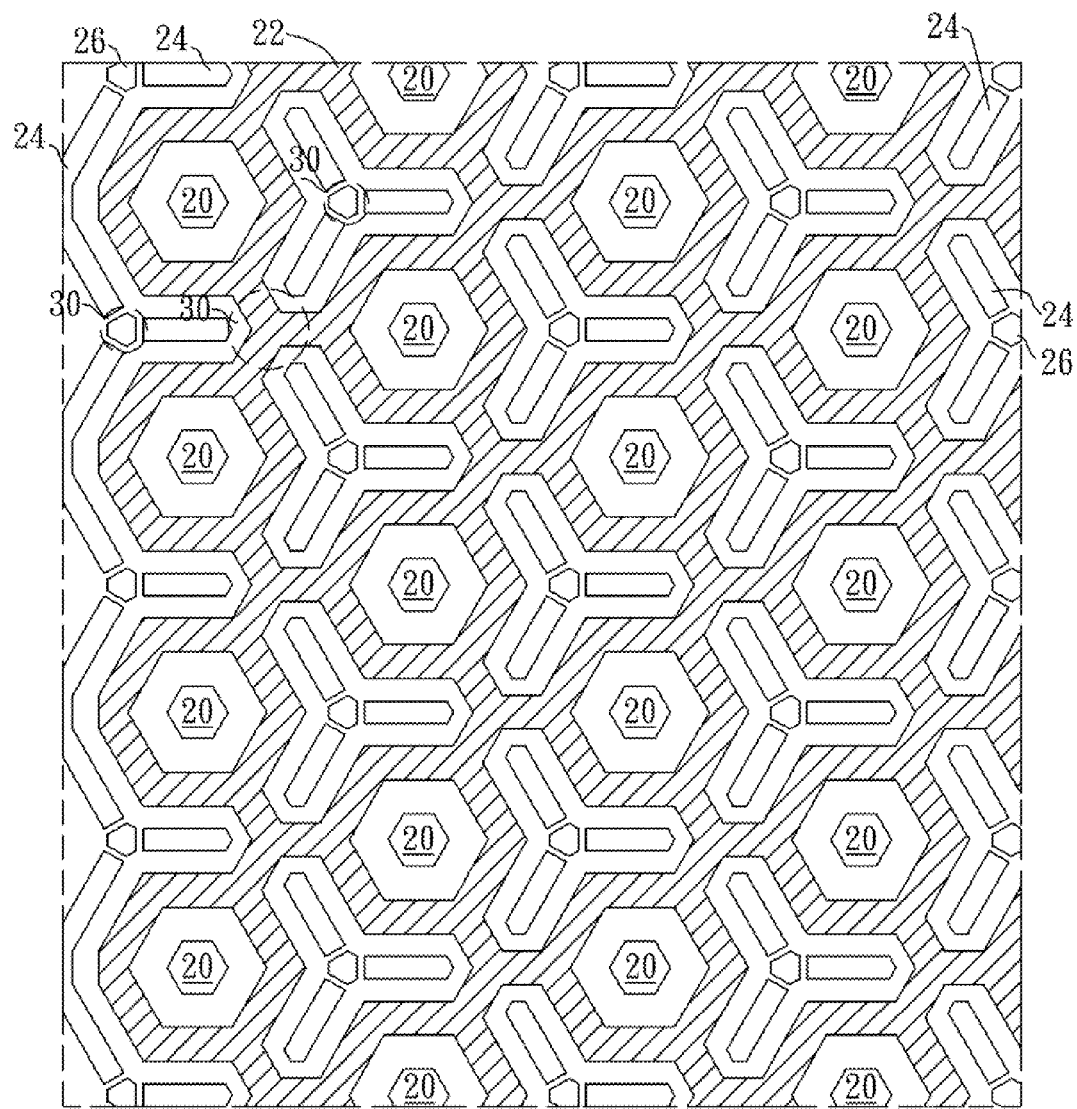
FIG. 9 is a schematic diagram of a MOSFET layout according to a sixth embodiment of the invention.

Besides quadrilateral, the shape of the MOSFET may be a hexagon, any other polygon, or circle, etc. FIG. 9 is a schematic diagram of a MOSFET layout according to a sixth embodiment of the invention. Referring to FIG. 9, the form of the drain region 20 is hexagon in the present embodiment, which has six corners. The gate region 22 is disposed outside the drain region 20 and adjacent to the drain region 20. The gate region 22 has extending regions corresponding to three corners of the six corners of the drain region 20, so as to connect with the gate region 22 of corresponding MOSFET. The body region 26 has three body portions, corresponding to other three corners of the six corners of the gate region 22. The source region 24 is formed outside the gate region 22 and adjacent to the gate region 22. Besides, each of the source regions 24 of MOSFETs has six source sections, which are corresponding to the six sides of the drain region 20. The above MOSFET and its' adjacent six MOSFET use source section in common as the source region 24. Each of the body portions of the body region 26 is adjacent to three source sections to reach the effect for using the body region 26 in common.

As the above description, the invention completely complies with the patentability requirements: novelty, non-obviousness, and utility. It will be apparent to those skilled in the art that various modifications and variations can be made to the structure of the invention without departing from the scope or spirit of the invention. In view of the foregoing descriptions, it is intended that the invention covers modifications and variations of this invention if they fall within the scope of the following claims and their equivalents.

The reader's attention is directed to all papers and documents which are filed concurrently with his specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A MOSFET layout, comprising:
   a drain region;
   a gate region, disposed outside the drain region and adjacent to the drain region, wherein the gate region has two gate window regions, and the drain region is not surrounded by the gate region entirely;
   a source region, having a plurality of source sections, which are disposed outside the gate region and adjacent to the gate region, wherein each of two adjacent source sections has a source blank zone there between; and
   a body region, having at least two body portions, Which are disposed at the source blank zones and adjacent to the gate region.

2. The MOSFET layout according to claim 1, wherein each of the source sections is adjacent to one body portion correspondingly.

3. The MOSFET layout according to claim 1, wherein each of the body portions is adjacent to four source sections correspondingly.

4. The MOSFET layout according to claim 3, wherein each of the source sections is adjacent to one body portion correspondingly.

5. The MOSFET layout according to claim 1, wherein each of the body portions is adjacent to three source sections correspondingly.

6. The MOSFET layout according to claim 1, wherein the body region has two body portions, which are correspondingly disposed to the two gate window regions respectively.

7. A MOSFET structure, comprising:
   a first MOSFET, comprising:
      a first drain region;
      a first gate region, disposed outside the first drain region and adjacent to the first drain region, wherein the first gate region has two first gate window regions, and the first drain region is not surrounded by the first gate region entirely;
      a first source region, disposed outside the first gate region and adjacent to the first gate region; and
      a first body region, having at least two first body portions, which are disposed outside the first gate region and adjacent to the first source region; and
   a second MOSFET, comprising:
      a second drain region;
      a second gate region, disposed outside the second drain region and adjacent to the second drain region, wherein the second gate region has two second gate window regions, and the second drain region is not surrounded by the second gate region entirely;
      a second source region, disposed outside the second gate region and adjacent to the second gate region; and
      a second body region, having at least two second body portions, which are disposed outside the second gate region and adjacent to the second source region, wherein the partial region of the first source region and the partial region of the second source region are in common.

8. The one of MOSFET structure according to claim 7, wherein at least one of the first body portions of the first body region and at least one of the second body portions of the second body region are in common.

9. The MOSFET structure according to claim 8, wherein shape of the first drain region is a hexagon, and each side of which is corresponding to one of the first source sections.

10. The MOSFET structure according to claim 7, wherein the first source region has a plurality of first source sections, and each of the first source sections is adjacent to at least one of the first body portions; the second source region has a plurality of second source sections, and each of the second source sections is adjacent to at least one of the second body portions.

11. The one of MOSFET structure according to claim 10, wherein at least one of the first body portions of the first body region and at least one of the second body portions of the second body region are in common.

12. The MOSFET structure according to claim 10, wherein the shape of the first drain region is a quadrilateral, and each side of which is corresponding to one of the first source sections.

13. The MOSFET structure according to claim 12, wherein the first drain region has four corners, and the first body region has two first body portions, which are respectively corresponding to two corners of the four corners.

14. The MOSFET structure according to claim 13, wherein the first gate region has two extending regions, and the two extending regions are respectively corresponding to two corners of the four corners, and one of the two extending regions is connected to the second gate region.

15. The MOSFET structure according to claim 7, wherein the first body region is adjacent to the first gate region, and the second body region is adjoined to the second gate region.

16. The one of MOSFET structure according to claim 15, wherein at least one of the first body portions of the first body region and at least one of the second body portions of the second body region are in common.

* * * * *